United States Patent
Pillarisetty (10) Patent No.: US 8,541,773 B2
(45) Date of Patent: Sep. 24, 2013

(54) VERTICAL TUNNELING NEGATIVE DIFFERENTIAL RESISTANCE DEVICES

(75) Inventor: Ravi Pillarisetty, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 102 days.

(21) Appl. No.: 13/098,617

(22) Filed: May 2, 2011

(65) Prior Publication Data

US 2012/0280210 A1 Nov. 8, 2012

(51) Int. Cl.
*H01L 29/78* (2006.01)
*H01L 21/336* (2006.01)

(52) U.S. Cl.
USPC ............... 257/24; 257/E29.27; 257/E21.441; 438/282

(58) Field of Classification Search
None
See application file for complete search history.

(56) References Cited

U.S. PATENT DOCUMENTS

| | | | | |
|---|---|---|---|---|
| 3,588,736 | A * | 6/1971 | McGroddy | 331/47 |
| 4,257,055 | A * | 3/1981 | Hess et al. | 257/6 |
| 4,806,998 | A * | 2/1989 | Vinter et al. | 257/192 |
| 4,807,001 | A * | 2/1989 | Hida | 257/192 |
| 4,816,878 | A * | 3/1989 | Kano et al. | 257/17 |
| 4,862,228 | A * | 8/1989 | Ralph | 257/14 |
| 4,868,612 | A * | 9/1989 | Oshima et al. | 257/14 |
| 4,903,092 | A * | 2/1990 | Luryi et al. | 257/183.1 |
| 5,055,891 | A * | 10/1991 | Moll et al. | 257/201 |
| 5,869,845 | A * | 2/1999 | Vander Wagt et al. | 257/25 |
| 6,498,360 | B1 | 12/2002 | Jain et al. | |
| 7,221,005 | B2 * | 5/2007 | Ogura et al. | 257/192 |
| 7,655,963 | B2 | 2/2010 | Sadaka et al. | |
| 7,875,958 | B2 * | 1/2011 | Cheng et al. | 257/617 |
| 7,884,764 | B2 * | 2/2011 | Itsuji | 343/700 MS |
| 8,216,951 | B2 * | 7/2012 | Cheng et al. | 257/E21.353 |
| 8,294,137 | B2 * | 10/2012 | Jain et al. | 257/24 |
| 2005/0152420 | A1 * | 7/2005 | Kim | 372/43 |
| 2006/0267045 | A1 | 11/2006 | Ogura et al. | |
| 2008/0073641 | A1 * | 3/2008 | Cheng et al. | 257/25 |
| 2009/0166677 | A1 | 7/2009 | Shibata et al. | |
| 2010/0213441 | A1 | 8/2010 | Pillarisetty et al. | |

OTHER PUBLICATIONS

Of R. R. Daniels et al., "Quantum well p-channel Al—GaAs/InGaAs/GaAs heterostructure insulated gate field effect transistors with very high transconductance," IEEE Electron Device Lett.,vol. 9, 1988.*
R. R. Daniels et al., "Quantum well p-channel Al-GaAs/InGaAs/GaAs heterostructure insulated gate field effect transistors with very high transconductance," IEEE Electron Device Lett.,vol. 9, 1988.*
Watanabe, Kazuo and Yokoyama, H., 'Photoluminescence spectra from σ-doped barrier layers in modulation doped InAlAs/InGaAs field-effect transistor structures', Appl. Phys. Lett. 76, 973 (2000).*

(Continued)

*Primary Examiner* — Thomas L Dickey
*Assistant Examiner* — Joseph Schoenholtz
(74) *Attorney, Agent, or Firm* — Winkle, PLLC (57) ABSTRACT

The present disclosure relates to the fabrication of microelectronic devices having at least one negative differential resistance device formed therein. In at least one embodiment, the negative differential resistance devices may be formed utilizing quantum wells. Embodiments of negative differential resistance devices of present description may achieve high peak drive current to enable high performance and a high peak-to-valley current ratio to enable low power dissipation and noise margins, which allows for their use in logic and/or memory integrated circuitry.

15 Claims, 8 Drawing Sheets

(56) References Cited

OTHER PUBLICATIONS

R. R. Daniels et al., "Quantum well p-channel Al—GaAs/InGaAs/GaAs heterostructure insulated gate field effect transistors with very high transconductance," IEEE Electron Device Lett.,vol. 9, 1988.*

Sugaya, T., T. Yamane, S. Hori, K. Komori, and K. Yonei. "Negative Differential Resistance of InGaAs Dual Channel Transistors." Journal of Physics: Conference Series 38 (2006): 108-11.*

International Search Report and Written Opinion Received for PCT Patent Application No. PCT/US2011/067041, Mailed on Aug. 30, 2012, 9 pages.

* cited by examiner

VERTICAL TUNNELING NEGATIVE DIFFERENTIAL RESISTANCE DEVICES

BACKGROUND OF THE INVENTION

The present disclosure relates generally to the fabrication of microelectronic devices, which may include negative differential resistance devices formed therein.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present invention. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

In various embodiments of the present description, negative differential resistance devices may be formed utilizing quantum wells, wherein such devices are used in microelectronic device applications. Negative differential resistance is a property of some electric circuits where an increase in voltage entering the circuit may result in a decrease in current across the same circuit, wherein this property is exhibited in at least some part of the operating range of the electric circuit. Embodiments of the negative differential resistance devices of present description may achieve high peak drive current to enable high performance and a high peak-to-valley current ratio to enable low power dissipation and noise margins, as will be understood by those skilled in the art. Thus embodiments of the present description may be utilized in logic and/or memory integrated circuitry.

Figure 1:
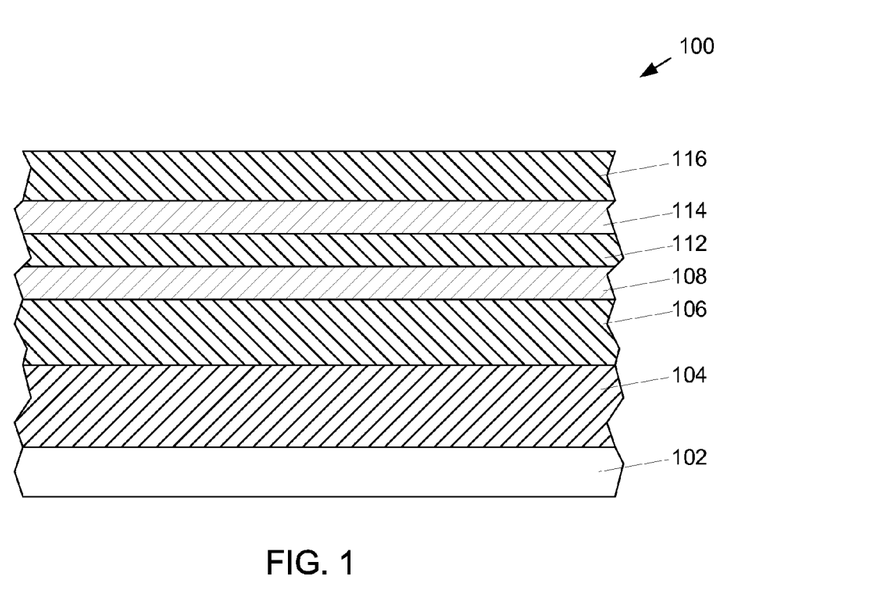
FIGS. 1-13 illustrate side cross-sectional schematic depictions of a process of forming a vertical tunneling negative differential resistance device in accordance with embodiments of the present description.

FIG. 1 is a cross-section schematic of a layered structure 100 according to one embodiment of the present description. The layered structure 100 may include a microelectronic substrate 102, such as an appropriate silicon-containing material. A buffer layer 104 may be formed on the microelectronic substrate 102. In one embodiment of the present description, the buffer layer 104 may be formed from gallium arsenide (GaAs).

It is understood that a nucleation layer (not shown) could be formed on the microelectronic substrate 102 prior to the formation of the buffer layer 104, and that the buffer layer 104 may comprise multiple layers. The buffer layer 104 may also be graded to provide for gliding dislocation and control of the lattice mismatch between the microelectronic substrate 102 and a bottom barrier layer to be formed over the buffer layer 104.

After the formation of the buffer layer 104, a bottom barrier layer 106 may be formed on the buffer layer 104. In one embodiment, the bottom barrier layer 106 may be formed of a larger bandgap material than the material of a quantum well to be formed on the bottom barrier layer 106. In one embodiment, the bottom barrier layer 106 may comprise indium aluminum arsenide ($In_xAl_{1-x}As$). In another embodiment, the bottom barrier layer 106 may be graded. In a specific embodiment, the bottom barrier layer 106 may comprise indium aluminum arsenide ($In_xAl_{1-x}As$) with a grading that may proceed from x equals zero to x equals 0.52. Thus, the composition at the interface between the bottom barrier layer 106 and the buffer layer 104 may begin as aluminum arsenide (AlAs) and may finish at the other boundary thereof as $In_{0.52}Al_{0.48}As$. In another embodiment, the bottom barrier layer 106 may comprise indium aluminum arsenide ($In_xAl_{1-x}As$) where the grading may be linear by changing an indium supply during formation in a linearly increasing manner from aluminum arsenide (AlAs) until reaching the composition of indium aluminum arsenide, such as $In_{0.52}Al_{0.48}As$. In yet another embodiment, the bottom barrier layer 106 may comprise indium aluminum arsenide ($In_xAl_{1-x}As$) with a non-linear grading, where the indium supply may be provided in a non-linearly increasing manner such that the bottom barrier layer 106 may have one of a greater- or a lesser-than-half concentration of indium at the physical midpoint of this bottom buffer layer 106. By forming the bottom buffer layer 106, dislocations may glide along relatively diagonal planes therein, as will be understood by those skilled in the art.

After the formation of the bottom barrier layer 106, a lower quantum well 108 may be formed thereon. In one embodiment, the lower quantum well 108 may be formed of a material that has a smaller bandgap than that of the bottom barrier layer 106. In one embodiment, the lower quantum well 108 may formed from indium gallium arsenide. In a specific embodiment, the lower quantum well 108 may be indium gallium arsenide, i.e. $In_xGa_{1-x}As$, where x equals between about 0.53 and 0.8. In an embodiment, the lower quantum well 108 may be doped to enhance efficiency. In various embodiments, the lower quantum well 108 may be doped with either a p-dopant, such as boron, or an n-dopant, such as phosphorous. The doping of the lower quantum well 108 may be achieved by any technique known in the art. Further, the lower quantum well 108 may be doped directly or by delta doping through a subsequently formed layer or layers, as will be understood by those skilled in the art. Moreover, the lower quantum well 108 may be modulation doped, as will be understood by those skilled in the art.

A barrier layer 112 may be formed over the lower quantum well 108. In one embodiment, the barrier layer 112 may comprise indium aluminum arsenide, e.g. $In_xAl_{1-x}As$.

An upper quantum well 114 may be formed on the barrier layer 112 thereon. In one embodiment, the upper quantum well 114 may formed from indium gallium arsenide. In a specific embodiment, the upper quantum well 108 may comprise indium gallium arsenide, i.e. $In_xGa_{1-x}As$, where x equals between about 0.53 and 0.8. In one embodiment, the upper quantum well 114 may be doped to enhance efficiency. In various embodiments, the upper quantum well 114 may be doped with either a p-dopant, such as boron, or an n-dopant, such as phosphorous. The doping of the upper quantum well 114 may be achieved by any technique known in the art. Further, the upper quantum well 114 may be doped directly or by delta doping through a subsequently formed layer or layers, as will be understood by those skilled in the art. Moreover, the upper quantum well 114 may be modulation doped, as will be understood by those skilled in the art.

In one embodiment, both the lower quantum well 108 and the upper quantum well 114 may be undoped. In another embodiment, both the lower quantum well 108 and the upper quantum well 114 may be doped. In a further embodiment, one of the lower quantum well 108 and the upper quantum well 114 may be doped with the other being undoped.

A top barrier layer 116 may be optionally formed over the upper quantum well 114. In one embodiment, the top barrier layer 116 may comprise indium aluminum arsenide, e.g. $In_xAl_{1-x}As$.

It is understood that the layered structure 100 shown in FIG. 1 is merely exemplary and may include a variety of buffer layers, barrier layers, modulation doped halo layers, spacer layers, and the like, to achieve desired results, as will be understood by those skilled in the art. Furthermore, a variety of materials and systems could be used without departing from the present description. It is further understood that the various layers in the layered structure 100 may be fabricated by any known technique in the art including, but not limited to, chemical vapor deposition ("CVD"), physical vapor deposition ("PVD"), atomic layer deposition ("ALD"), molecular beam epitaxy (MBE), metal-organic chemical vapor deposition epitaxy (MOCVD epi), ultra-high vacuum CVD epitaxy (UHCVD epi), and reduced-temperature CVD epitaxy (RTCVD epi).

Figure 2:
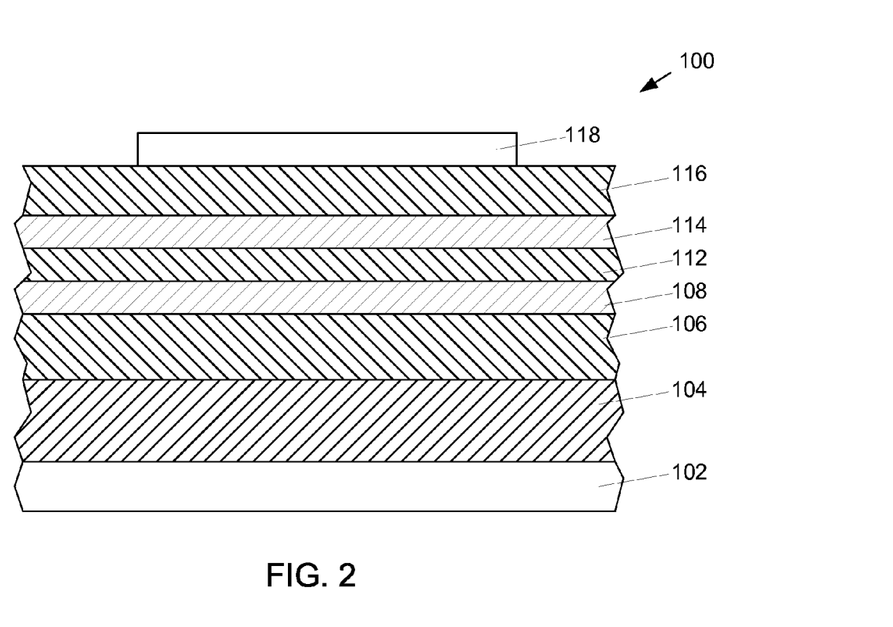
Figure 3:
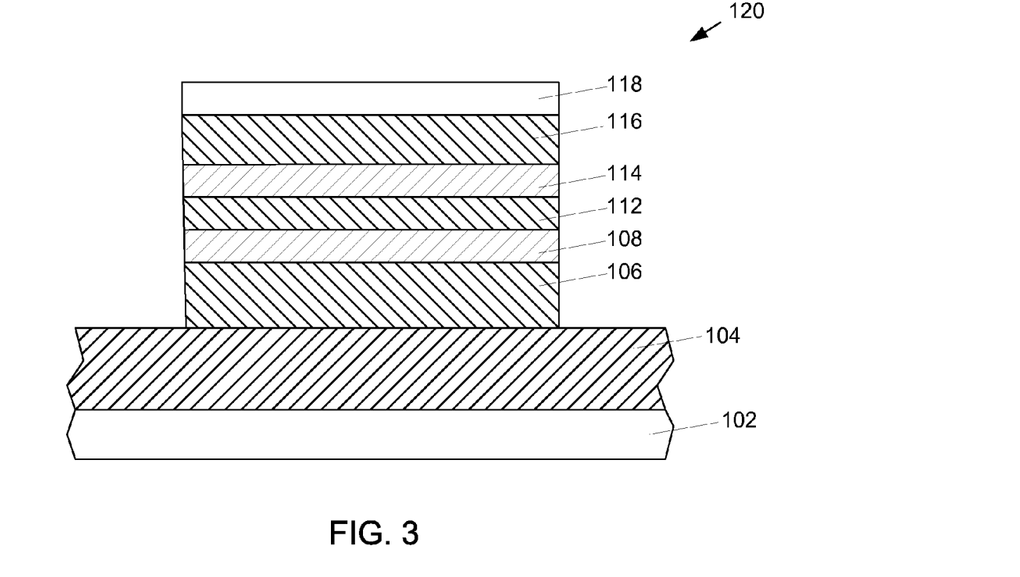

As shown in FIG. 2, a mask 118 may be patterned on the top barrier layer 116. The mask 118 may be formed by any technique known in the art, including but not limited to lithography. The layered structure 100 of FIG. 2 may then be etched as shown in FIG. 3, wherein the layers (buffer layer 104, bottom barrier layer 106, lower quantum well 108, barrier layer 112, upper quantum well 114, and top barrier layer 116) protected by the mask 118 remain to form a double quantum well stack structure 120. In various, embodiments of the present description, the etch may be selective to stop in or on the buffer layer 104, as shown in FIG. 3, or may be selective to stop on or in the bottom barrier layer 106.

Figure 4:
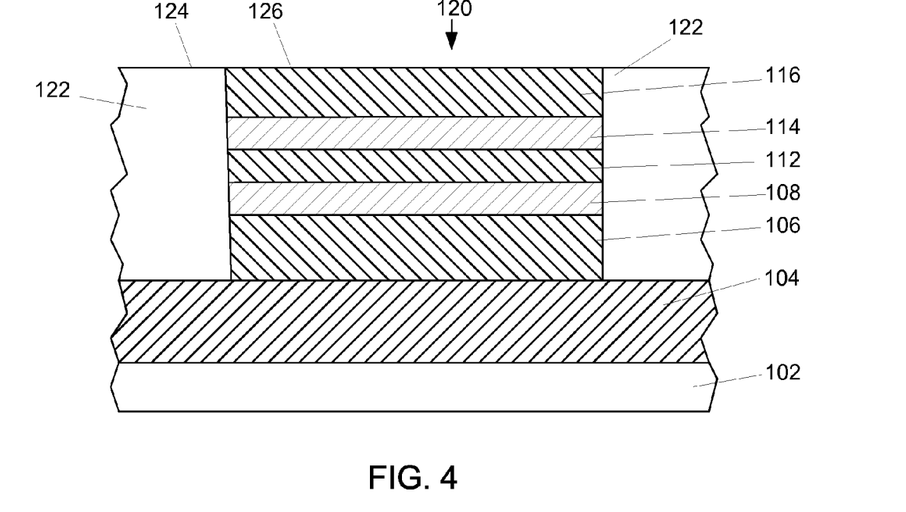

As shown in FIG. 4, the mask 118 may be removed and a dielectric material 122 formed to abut the double quantum well stack structure 120. In one embodiment, the dielectric material 122 may be blanket deposited over the double quantum well stack structure 120, then planarized to have an outer surface 124 that is substantially planar to an outer surface 126 of the top barrier layer 116. The dielectric material 122, may include, but is not limited to, silicon dioxide ($SiO_2$), silicon oxynitride ($SiO_xN_y$), and silicon nitride ($Si_3N_4$). The dielectric material 122 may be planarized by any technique known in the art, including, but not limited to, wet or dry etching and chemical mechanical polishing.

Figure 5:
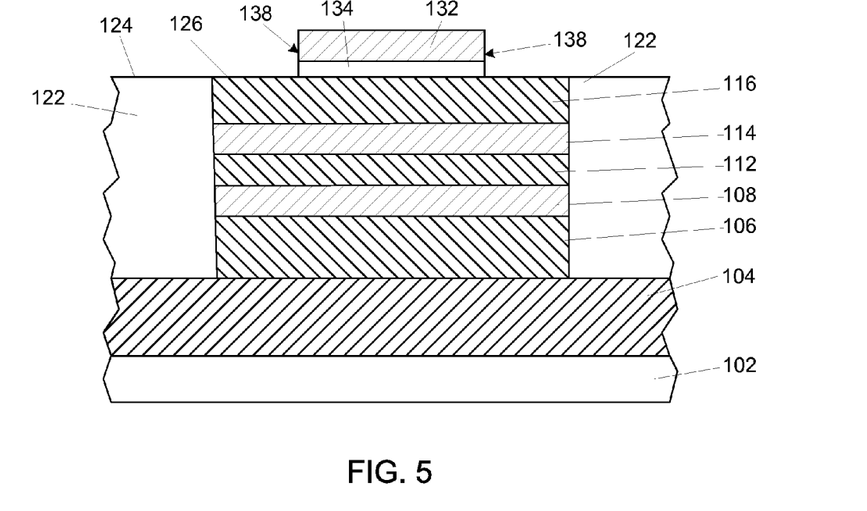

As shown in FIG. 5, a gate electrode 132 may be formed on the top barrier layer outer surface 126. The gate electrode 132 may be used to modulate the electron density in the upper quantum well 114, as will be discussed. In one embodiment, a gate dielectric 134 may be formed between the gate electrode 132 and the top barrier layer 116. The gate dielectric 134 may be any appropriate dielectric material, including, but not limited to, high K (high dielectric constant) materials, such as hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. The gate electrode 132 and/or the gate dielectric 134 may be fabricated by well-known techniques, such as chemical vapor deposition ("CVD"), physical vapor deposition ("PVD"), atomic layer deposition ("ALD"), and then patterning with well-known photolithography and etching techniques, as will be understood by those skilled in the art.

Figure 6:
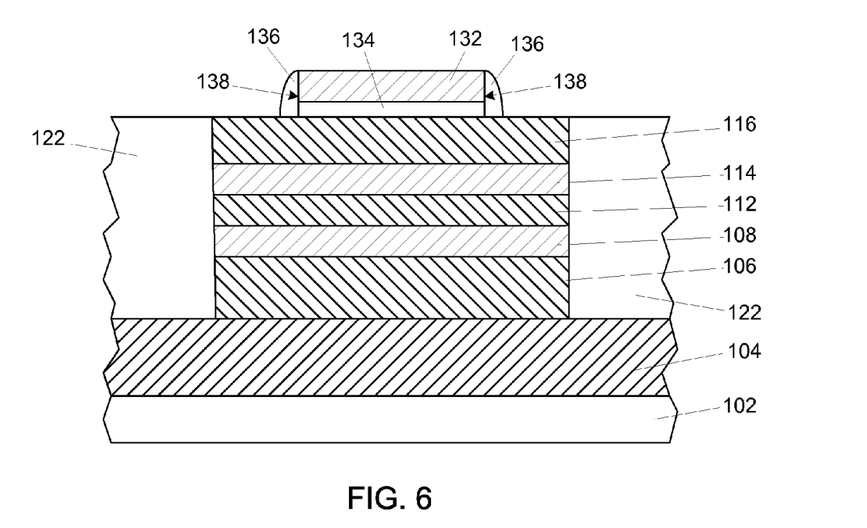

As shown in FIG. 6, gate dielectric spacers 136 may be formed to abut sides 138 of the gate electrode 132. The gate dielectric spacers 136 may be formed from any appropriate dielectric material, including, but not limited to, silicon dioxide ($SiO_2$) and silicon nitride ($Si_3N_4$). The gate dielectric spacers 136 may be fabricated by any known techniques, including but not limited to conformal deposition followed by etching, as will be understood by those skilled in the art.

Figure 7:
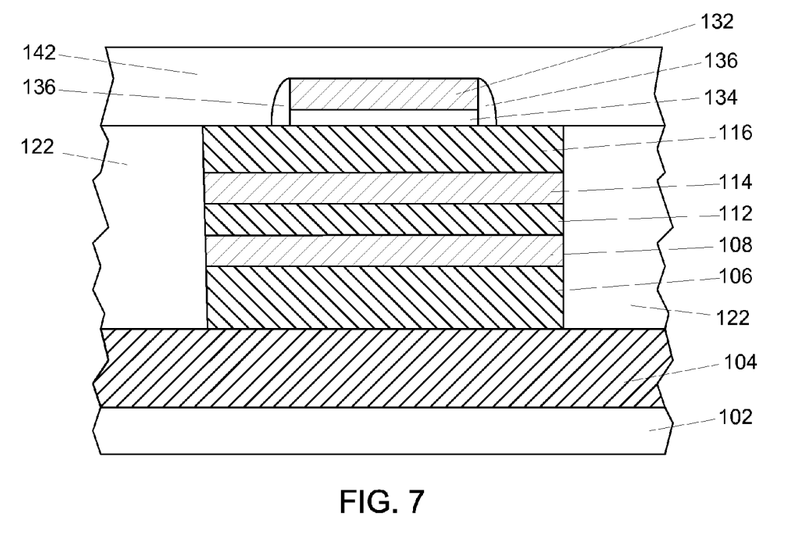

As shown in FIG. 7, an interlayer dielectric 142 may be formed over the gate electrode 132, the gate dielectric spacers 136, the top barrier layer outer surface 126, and the dielectric material outer surface 124. The interlayer dielectric 142 may be any appropriate dielectric material, including, but not limited to, silicon dioxide ($SiO_2$). The interlayer dielectric 142 may be fabricated by any known techniques, including but not limited to deposition followed by planarization, as will be understood by those skilled in the art.

Figure 8:
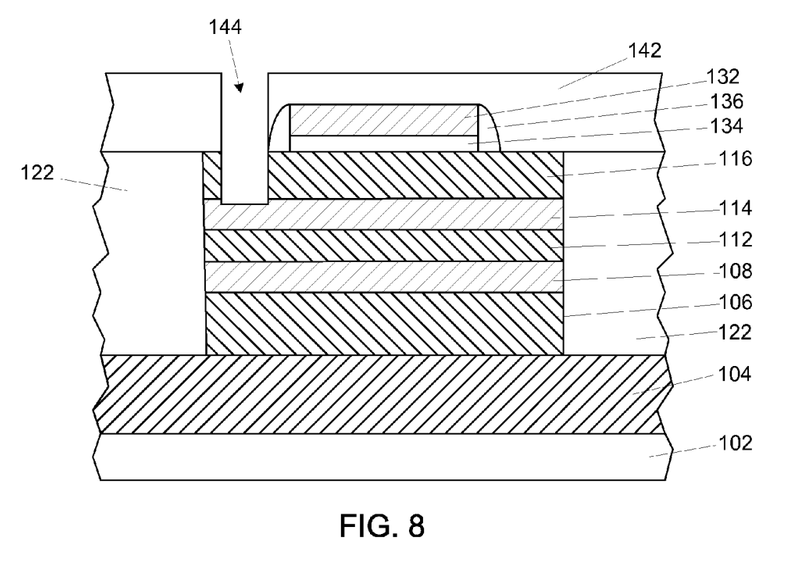

As shown in FIG. 8, a first opening 144 may be formed through the interlayer dielectric 142 and the top barrier layer 116 to expose a portion of the upper quantum well 114. The first opening 144 may be formed by any technique known in the art, including but not limited to lithographic etching, laser drilling, ion drilling, wet etching, dry etching, or any combination thereof. In one embodiment, a lithographic etching technique may be used, wherein a mask (not shown) is patterned on the interlayer dielectric 142. The interlayer dielectric 142 and the top barrier layer 116 may then be etched through the mask (not shown) with an etchant that is selective to the material of the upper quantum well 114, such that the etching stops on or in the upper quantum well 114.

Figure 9:
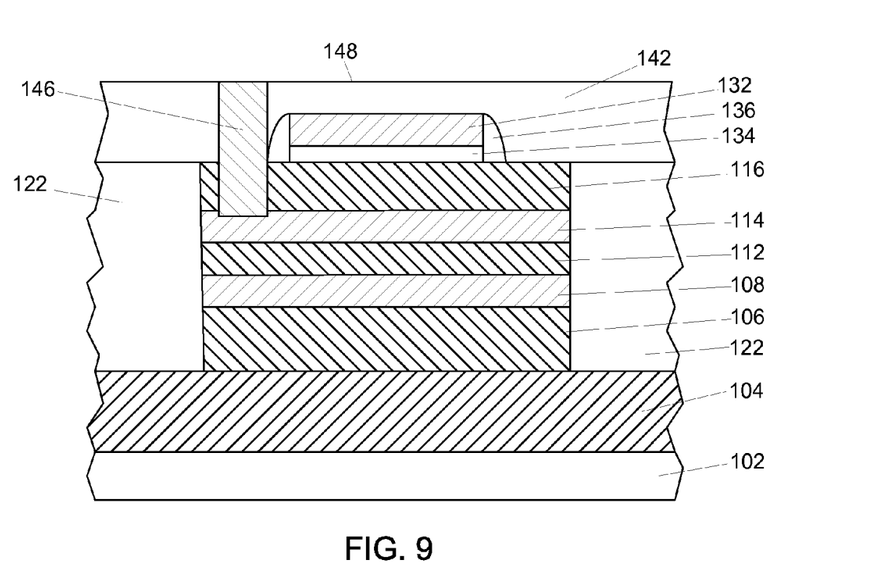

As shown in FIG. 9, an upper quantum well contact 146 may be formed in the first opening 144 (see FIG. 8). The upper quantum well contact 146 may be formed by any techniques known in the art. In one embodiment, a conductive material may be deposited, such as by chemical vapor deposition ("CVD"), physical vapor deposition ("PVD"), atomic layer deposition ("ALD"), and the like, in the first opening 144 (see FIG. 8) and on an outer surface 148 of the interlayer dielectric 142. A portion of the conductive material may then be removed from the interlayer dielectric outer surface 148, such as by chemical mechanical polishing or etching, from the interlayer dielectric outer surface 148, to form the upper quantum well contact 146. The conductive material may include, but not limited to copper, aluminum, silver, titanium, gold, alloys thereof, and the like.

Figure 10:
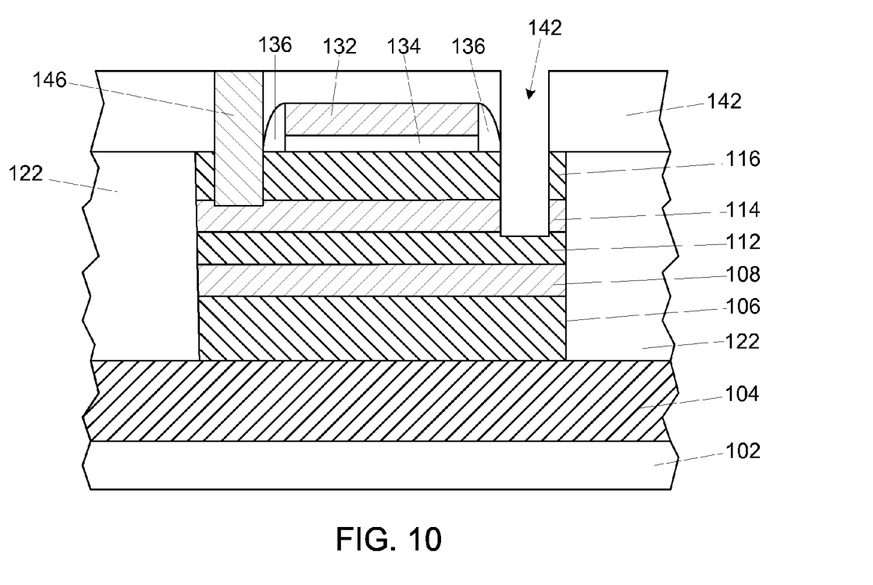

A lower quantum well contact may then be formed, as shown in FIGS. 10-13. As shown in FIG. 10, a second opening 152 may be formed through the interlayer dielectric 142, the top barrier layer 116, and the upper quantum well 114. The second opening 152 may be formed by any technique known in the art, including but not limited to lithographic etching, laser drilling, ion drilling, wet etching, dry etching, or any combination thereof. In one embodiment, a lithographic etching technique may be used, wherein a mask (not shown) is patterned on the interlayer dielectric 142. The interlayer dielectric 142 and the top barrier layer 116 may then be etched through the mask (not shown) with a first etchant that is selective to the material of the upper quantum well 114, such that the etching stops on or in the upper quantum well 114. A second etchant may then be employed to etch through the upper quantum well 114. The second etchant may be selective to the material of the barrier layer 112, such that the etching stops on or in the barrier layer 112.

Figure 11:
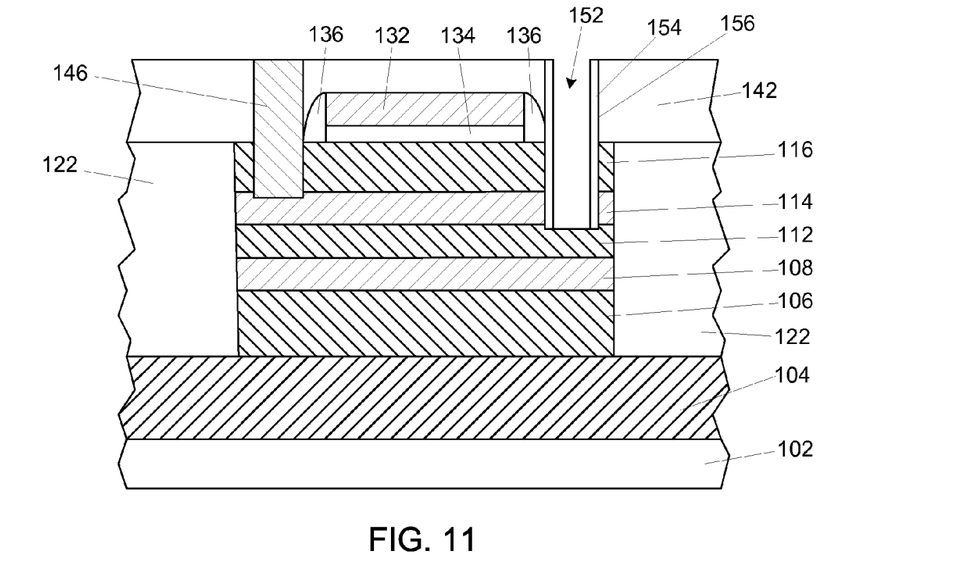

In order to isolate the upper quantum well 114 from the subsequently formed lower quantum well contact, a contact dielectric spacer 154 may be formed on sidewalls 156 of the second opening 152, as shown in FIG. 11. The contact dielectric spacers 154 may be formed from any appropriate dielectric material, including, but not limited to, silicon dioxide ($SiO_2$) and silicon nitride ($Si_3N_4$). The contact dielectric spacer 154 may be fabricated by any known techniques, including but not limited to conformal deposition followed by etching to expose a portion of the barrier layer 112 within the second opening 152, as will be understood by those skilled in the art.

Figure 12:
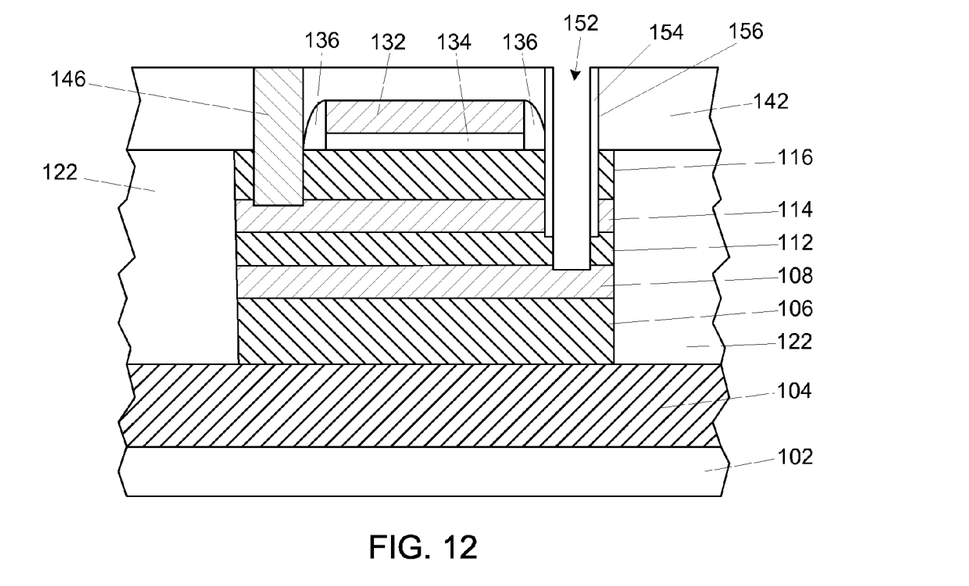

A third etchant may then be employed to extend the second opening 152 through the barrier layer 112. The third etchant may be selective to the material of the upper quantum well 114, such that the etching stops on or in the upper quantum well 114. It is understood that the third etchant may be the same as the first etchant.

Figure 13:
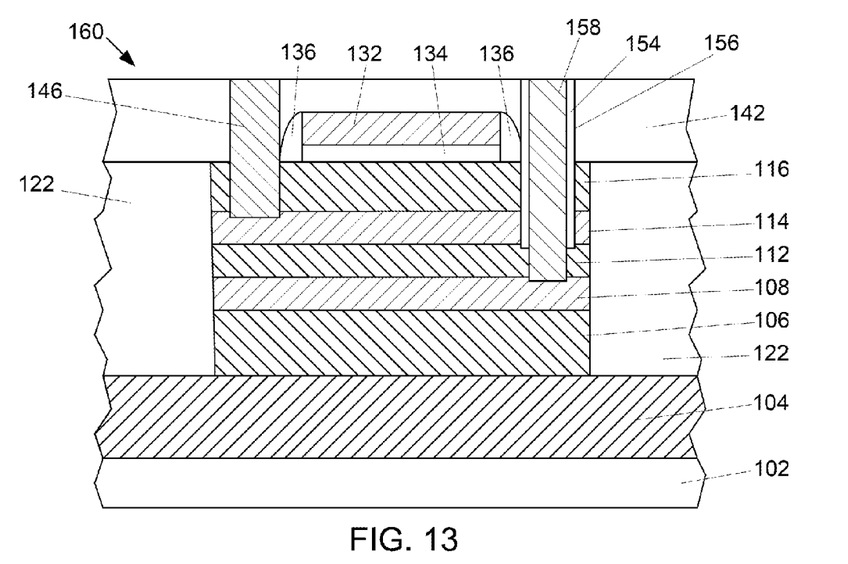

As shown in FIG. 13, a lower quantum well contact 158 may be formed in the second opening 152 (see FIG. 12). The lower quantum well contact 158 may be formed by any technique known in the art. In one embodiment, a conductive material may be deposited, such as by chemical vapor deposition ("CVD"), physical vapor deposition ("PVD"), atomic layer deposition ("ALD"), and the like, in the second opening 152 (see FIG. 12) and on the interlayer dielectric outer surface 142. A portion of the conductive material may be removed from the interlayer dielectric outer surface 148, such as by chemical mechanical polishing or etching, from the interlayer dielectric outer surface 148, to form the lower quantum well contact 158. The conductive material may include, but not limited to copper, aluminum, silver, titanium, gold, alloys thereof, and the like.

It is understood that the various fabrication steps, such as etching, deposition, and lithographic patterning, used in the formation of the upper quantum well contact 146 and the lower quantum well contact 158 may be performed simultaneously, where appropriate.

The resulting microelectronic device 160, as shown in FIG. 13, is a double quantum well system, wherein the upper quantum well 114 and the lower quantum well 108 are each substantially planar to one other. In other words, the upper quantum well 114 and the lower quantum well 108 are substantially two dimensional (2D), and the planes formed by the upper quantum well 114 and the lower quantum well 108 are substantially parallel to one another. As the upper quantum well 114 and the lower quantum well 108 each have independent contacts (i.e. the upper quantum well contact 146 and lower quantum well contact 158, respectively) and are separated by the barrier layer 112, the upper quantum well 114 and lower quantum well 108 are not in direct electrical contact with one another.

The operation of the microelectronic device 160 is based on direct vertical tunneling between the upper quantum well 114 and the lower quantum well 108. In other words, it is based on tunneling between substantially parallel two-dimensional (2D) quantum wells. The underlying device physics is that energy-momentum conservation only allows tunneling when the electron densities are matched between the upper quantum well 114 and the lower quantum well 108. The gate electrode 132 may be used to modulate the electronic density of the upper quantum well 114 to match the electron densities to operate the microelectronic device 160. Thus, by using either drain bias or gate bias to imbalance the electron density in the upper quantum well 114 and the lower quantum well 108, a negative differential resistance can be achieved in the IV characteristics of the microelectronic device 160, as will be understood by those skilled in the art.

Figure 14:
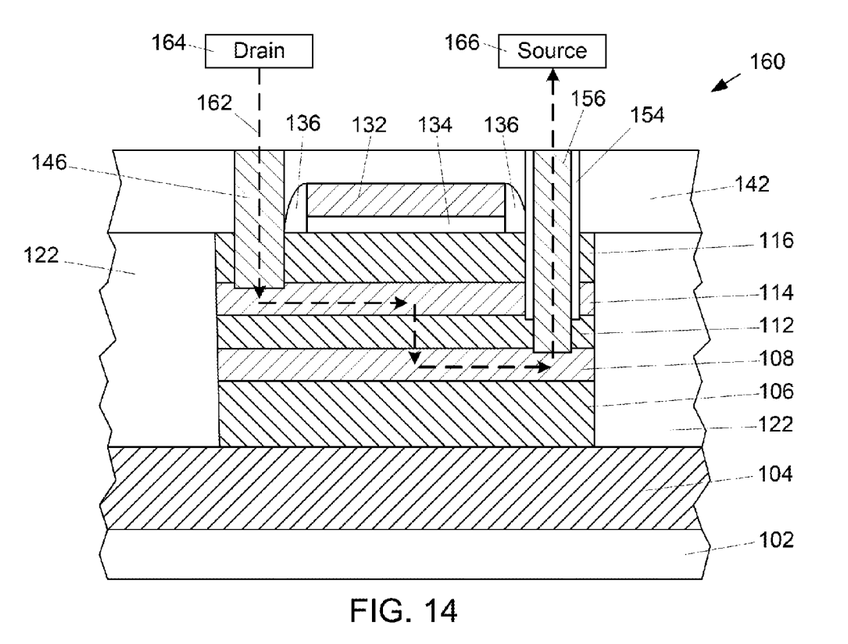
FIG. 14 illustrates side cross-sectional schematic current flow through a vertical tunneling negative differential resistance device in accordance with an embodiment of the present description.

In one example shown in FIG. 14, a current (shown as line 162) may flow from a drain 164 to the upper quantum well contact 146, flow through the upper quantum well contact 146 into the upper quantum well 114, tunnel through the barrier layer 112 into the lower quantum well 108, and flow through the lower quantum well contact 158 to a source 166 connected to the lower quantum well contact 158.

The microelectronic device 160 may achieve high peak drive current to enable performance, and high peak-to-valley current ratio to enable low power dissipation and noise margins. This is due to the fact that energy-momentum conservation can sharply suppress the tunneling current between the upper quantum well 114 and the lower quantum well 108. Thus, the microelectronic device 160 could be used as an oscillator, or for memory and/or logic integrated circuit applications.

Although the double quantum well structure 160 of the present description is described with examples of indium gallium arsenide quantum wells and an indium aluminum arsenide barrier layer (i.e. InGaAs/InAlAs system), it will be understood by those skilled in the art that the double quantum well structure 160 can be made with a variety of quantum well systems. In one embodiment, the quantum well systems can be made with a variety of Group III-V quantum well systems, including but not limited to, gallium arsenide/aluminum gallium arsenide systems (GaAs/AlGaAs), gallium arsenide/aluminum arsenide systems (GaAs/AlAs), indium antimony/indium aluminum antimony systems (InSb/InAlSb), indium antimony/indium gallium antimony systems (InSb/InGaSb), and the like. In another embodiment, the quantum well systems can be made with a variety of Group II-VI quantum well systems, including but not limited to zinc selenium/zinc cadmium selenium systems (ZnSe/ZnCdSe). In yet another embodiment, the quantum well systems can be made with silicon and germanium, including, but not limited to germanium/silicon germanium systems (Ge/SiGe), silicon germanium/silicon systems (SiGe/Si), and the like. In still other embodiments, the quantum well systems can be made from Group 4 quantum well systems, or can be made of any applicable generic heterostructure, double quantum well systems, as will be understood by those skilled in the art.

Figure 15:
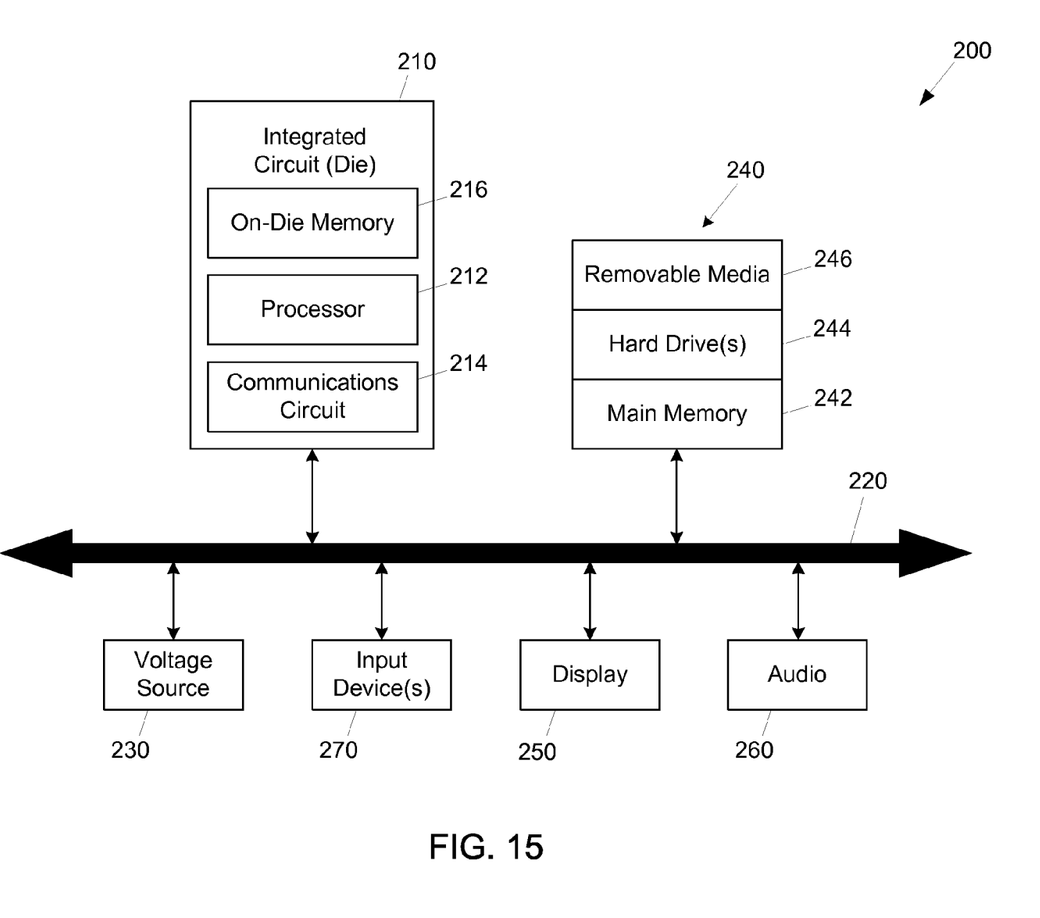
FIG. 15 is a schematic depiction of a system in accordance with one embodiment of the present description.

FIG. 15 is a schematic of an electronic system 200 utilizing the subject matter of the present description. The electronic system 200 may be any electronic device, including but not limited to portable devices, such as a portable computer, a mobile telephone, a digital camera, a digital music player, a web tablet, a personal digital assistant, a pager, an instant messaging device, or other devices. The electronic system 200 may be adapted to transmit and/or receive information wirelessly, such as through a wireless local area network (WLAN) system, a wireless personal area network (WPAN) system, and/or a cellular network.

In an embodiment, the electronic system 200 may include a system bus 220 to electrically couple the various components of the electronic system 200. The system bus 220 may be a single bus or any combination of busses according to various embodiments. The electronic system 200 may include a voltage source 230 that provides power to an integrated circuit 210. In some embodiments, the voltage source 230 may supply current to the integrated circuit 210 through the system bus 220.

The integrated circuit 210 may be electrically coupled to the system bus 220 and includes any circuit, or combination of circuits according to an embodiment. In an embodiment, the integrated circuit 210 may include a processor 212 that can be of any type. As used herein, the processor 212 may mean any type of circuit such as, but not limited to, a microprocessor, a microcontroller, a graphics processor, a digital signal processor, or another processor. Other types of circuits that can be included in the integrated circuit 210 are a custom circuit or an application-specific integrated circuit (ASIC), such as a communications circuit 214 for use in wireless devices such as cellular telephones, pagers, portable computers, two-way radios, and similar electronic systems. In an embodiment, the processor 210 may include on-die memory 216, such as static random-access memory (SRAM). In another embodiment, the integrated circuit 210 may include embedded on-die memory 216, such as embedded dynamic random-access memory (eDRAM) that can be utilized as a cache memory for the processor 212.

In an embodiment, the electronic system 200 also includes an external memory 240 that in turn may include one or more memory elements suitable to the particular application, such as a main memory 242 in the form of RAM or non-volatile memory, such as flash memory, one or more hard drives 244, and/or one or more drives that handle removable media 246, such as diskettes, compact disks (CDs), digital variable disks (DVDs), flash memory keys, and other removable media known in the art.

The electronic system 200 may include input devices 270, such as a keyboard, mouse, trackball, game controller, microphone, and the like, and output (I/O) device(s), such as a display device 250 and an audio output 260.

As shown herein, the integrated circuit 210 and/or the main memory 242 can include at least one negative differential resistance device of the present description. The integrated circuit 210 and/or main memory 242 may be implemented in a number of different embodiments, such as an electronic system, a computer system, or the like. The various embodiments of the vertical tunneling negative differential resistance devices of the present description and their art recognized equivalents may be including in the one or more methods of fabricating an integrated circuit, and one or more methods of fabricating an electronic assembly. The elements, materials, geometries, dimensions, and sequence of operations can all be varied to accommodate the vertical tunneling negative differential resistance devices, as described herein.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A microelectronic device, comprising:
   an upper quantum well;
   a lower quantum well separated from the upper quantum well by a barrier layer;
   a gate electrode separated from the upper quantum well by a top barrier layer;
   an upper quantum well contact extending through the top barrier layer and coupled to the upper quantum well; and
   a lower quantum well contact coupled to the lower quantum well, wherein the lower quantum well contact extends through the top barrier layer and the upper quantum well and is electrically isolated therefrom with a dielectric material.

2. The microelectronic device of claim 1, wherein at least one of said upper quantum well and said lower quantum well comprises indium gallium arsenide.

3. The microelectronic device of claim 1, wherein the barrier layer comprises indium aluminum arsenide.

4. The microelectronic device of claim 1, wherein at least one of said upper quantum well and said lower quantum well is n-doped.

5. The microelectronic device of claim 1, wherein at least one of said upper quantum well and said lower quantum well is p-doped.

6. The microelectronic device of claim 1, wherein the gate electrode is adapted to modulate current density in the upper quantum well.

7. A method of fabrication a microelectronic device, comprising:
   forming a lower quantum well;
   forming a barrier layer proximate the lower quantum well;
   forming an upper quantum well proximate the barrier layer;
   forming a gate electrode separated from the upper quantum well by a top barrier layer;
   forming an upper quantum well contact extending through the top barrier layer and coupled to the upper quantum well; and
   forming a lower quantum well contact coupled to the lower quantum well comprising:
      forming an opening through the top barrier layer and the upper quantum well;
      depositing a dielectric material on sidewalls of the opening;
      extending the opening through the barrier layer to expose a portion of the lower quantum well; and
      depositing a conductive material to fill the opening.

8. The method of claim 7, wherein forming the lower quantum well comprises forming an indium gallium arsenide lower quantum well.

9. The method of claim 7, wherein forming the upper quantum well comprises forming an indium gallium arsenide upper quantum well.

10. The method of claim 7, wherein forming the barrier layer comprises forming an indium aluminum arsenide barrier layer.

11. The method of claim 7, further comprising doping at least one of said upper quantum well and said lower quantum well.

12. The method of claim 7, further comprising:
providing a microelectronic substrate;
forming a buffer layer on the microelectronic substrate; and
forming a bottom barrier layer on the buffer layer;
wherein forming the lower quantum well comprises forming the lower quantum well on the bottom barrier layer.

13. A system, comprising:
an integrated circuit device; and
a main memory;
wherein at least one of said integrated circuit device and said main memory includes a microelectronic device comprising an upper quantum well, a lower quantum well separated from the upper quantum well by a barrier layer; a gate electrode separated from the upper quantum well by a top barrier layer; an upper quantum well contact extending through the top barrier layer and coupled to the upper quantum well; and a lower quantum well contact coupled to the lower quantum well, wherein the lower quantum well contact extends through the top barrier layer and the upper quantum well and is electrically isolated therefrom with a dielectric material.

14. The system of claim 13, wherein at least one of said upper quantum well and said lower quantum well comprises indium gallium arsenide.

15. The system of claim 13, wherein the barrier layer comprises indium aluminum arsenide.

* * * * *